(12) United States Patent
Hosomi et al.

(10) Patent No.: US 8,339,840 B2
(45) Date of Patent: Dec. 25, 2012

(54) STORAGE ELEMENT AND MEMORY

(75) Inventors: Masanori Hosomi, Kanagawa (JP);
Hiroyuki Ohmori, Kanagawa (JP);
Minoru Ikarashi, Kanagawa (JP);
Tetsuya Yamamoto, Kanagawa (JP);
Yutaka Higo, Kanagawa (JP); Kazutaka Yamane, Kanagawa (JP); Yuki Oishi, Kanagawa (JP); Hiroshi Kano, Kanagawa (JP)

(73) Assignee: Sony Corporation, Tokyo (JP)

( * ) Notice: Subject to any disclaimer, the term of this patent is extended or adjusted under 35 U.S.C. 154(b) by 120 days.

(21) Appl. No.: 12/668,925

(22) PCT Filed: Jun. 30, 2008

(86) PCT No.: PCT/JP2008/061817
§ 371 (c)(1),
(2), (4) Date: Jan. 13, 2010

(87) PCT Pub. No.: WO2009/011216
PCT Pub. Date: Jan. 22, 2009

(65) Prior Publication Data
US 2010/0200939 A1    Aug. 12, 2010

(30) Foreign Application Priority Data

Jul. 19, 2007   (JP) .................................. 2007-188371

(51) Int. Cl.
*G11C 11/00*    (2006.01)
(52) U.S. Cl. ........ 365/158; 365/148; 365/171; 977/933; 977/935
(58) Field of Classification Search .................... 365/48, 365/55, 62, 66, 74, 78, 80–93, 100, 130, 365/131, 148, 158, 171–173, 209, 213, 225.5, 365/230.07, 232, 243.5; 216/22; 257/421, 257/E21.665; 428/810–816, 817–825.1, 428/826; 438/3; 977/933–935
See application file for complete search history.

(56) References Cited

U.S. PATENT DOCUMENTS 6,256,223 B1    7/2001    Sun
(Continued)

FOREIGN PATENT DOCUMENTS

JP    2003-017782    1/2003
(Continued)

OTHER PUBLICATIONS

Japanese Patent Office, Notice of reasons for refusal, issued in connection with Japanese Patent Application Serial No. 2007-188371, dated Apr. 24, 2012. (2 pages).
(Continued)

*Primary Examiner* — Richard Elms
*Assistant Examiner* — Harry W Byrne
(74) *Attorney, Agent, or Firm* — K&L Gates LLP

(57) ABSTRACT

A memory is provided that is capable of improving the thermal stability without increasing the write current. The memory is configured to include: a storage element which has a storage layer that holds information according to a magnetization state of a magnetic substance and in which a magnetization fixed layer is provided on the storage layer with an intermediate layer 16 interposed therebetween, the intermediate layer is formed of an insulator, the direction of magnetization of the storage layer is changed by injecting electrons spin-polarized in a lamination direction such that the information is recorded in the storage layer, and distortion is applied to the storage layer from an insulating layer which exists around the storage layer and has a smaller coefficient of thermal expansion than the storage layer. A wiring line for supplying a current flowing in the lamination direction of the storage element.

2 Claims, 6 Drawing Sheets

U.S. PATENT DOCUMENTS

| | | | |
|---|---|---|---|
| 6,842,317 B2 * | 1/2005 | Sugita et al. | 360/324.2 |
| 6,845,038 B1 * | 1/2005 | Shukh | 365/171 |
| 7,576,956 B2 * | 8/2009 | Huai | 360/324.2 |
| 7,675,129 B2 * | 3/2010 | Inomata et al. | 257/421 |
| 7,989,223 B2 * | 8/2011 | Inomata et al. | 438/3 |
| 2002/0163766 A1 * | 11/2002 | Eguchi et al. | 360/324.12 |
| 2004/0080876 A1 * | 4/2004 | Sugita et al. | 360/324.2 |
| 2004/0188733 A1 * | 9/2004 | Asao et al. | 257/295 |
| 2005/0036361 A1 * | 2/2005 | Fukuzumi | 365/158 |
| 2006/0018057 A1 * | 1/2006 | Huai | 360/324.2 |
| 2006/0044703 A1 * | 3/2006 | Inomata et al. | 360/324.1 |
| 2009/0180308 A1 * | 7/2009 | Inomata et al. | 365/145 |

FOREIGN PATENT DOCUMENTS

| | | |
|---|---|---|
| JP | 2004-047583 | 2/2004 |
| JP | 2005-079258 | 3/2005 |
| JP | 2006-278645 | 10/2006 |
| JP | 2007-103692 | 4/2007 |
| JP | 2007-173597 | 7/2007 |
| WO | 03/090290 | 10/2003 |

OTHER PUBLICATIONS

L. Berger, "Emission of spin waves by a magnetic multilayer traversed by a current," Phys. Rev. B, vol. 54, pp. 9353-9358, Oct. 1, 1996.

J. C. Slonczewski, "Current-driven excitation of magnetic multilayers," Journal of Magnetism and Magnetic Materials, vol. 159, Issues 1-2, pp. L1-L7, Jun. 1996.

International Search Report dated Aug. 18, 2008, for corresponding Patent Application PCT/JP2008/061817.

Japanese Patent Office, Notification of reasons for refusal, issued in connection with Japanese Patent Application Serial No. 2007-188371, dated Jul. 3, 2012. (4 pages).

* cited by examiner

[FIG. 1]
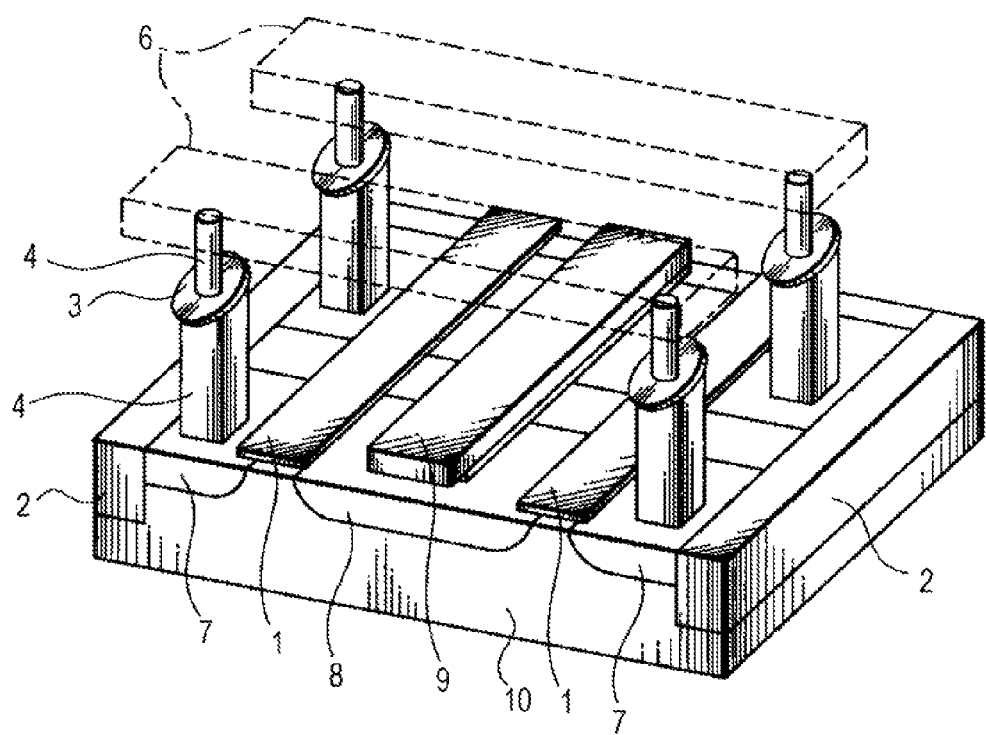

[FIG. 2]
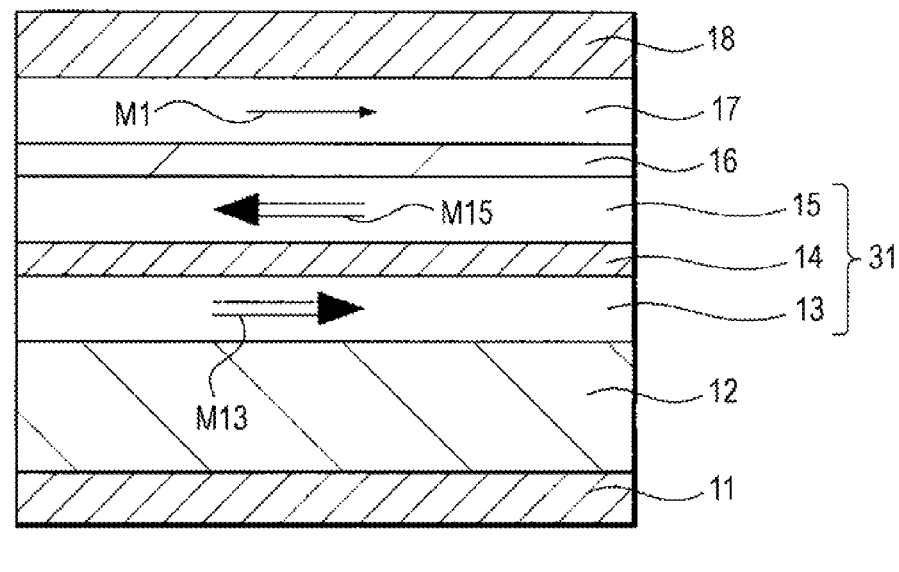
[FIG. 3]
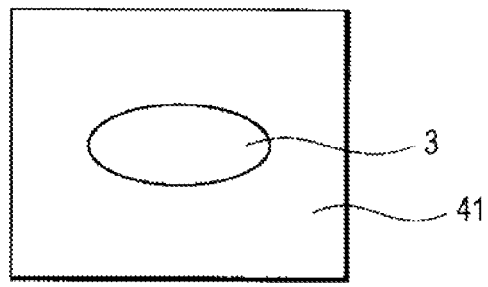
[FIG. 4]
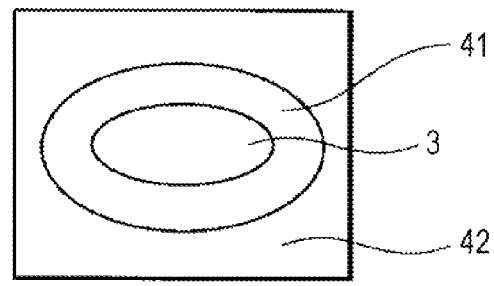

[FIG. 5]
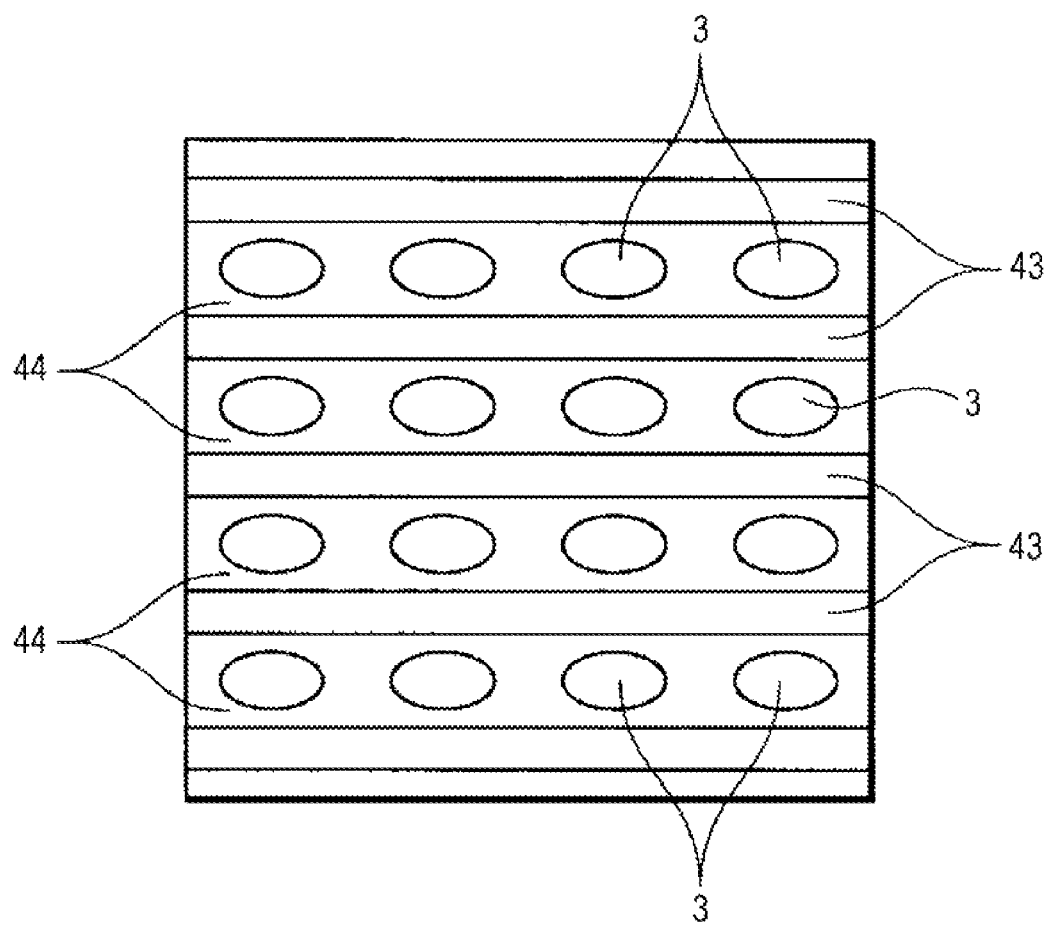

[FIG. 6A]
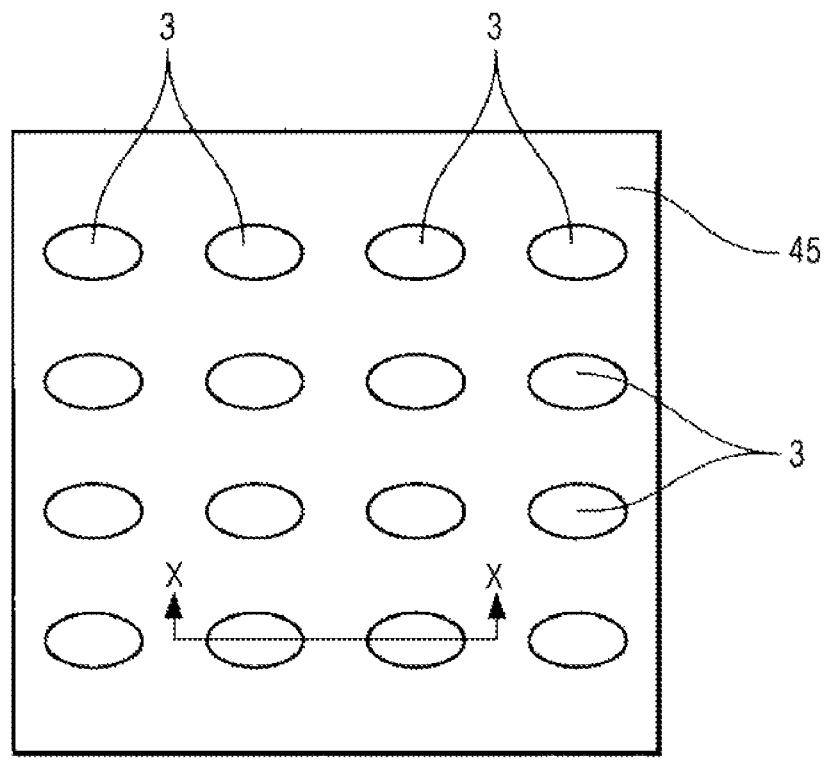
[FIG. 6B]
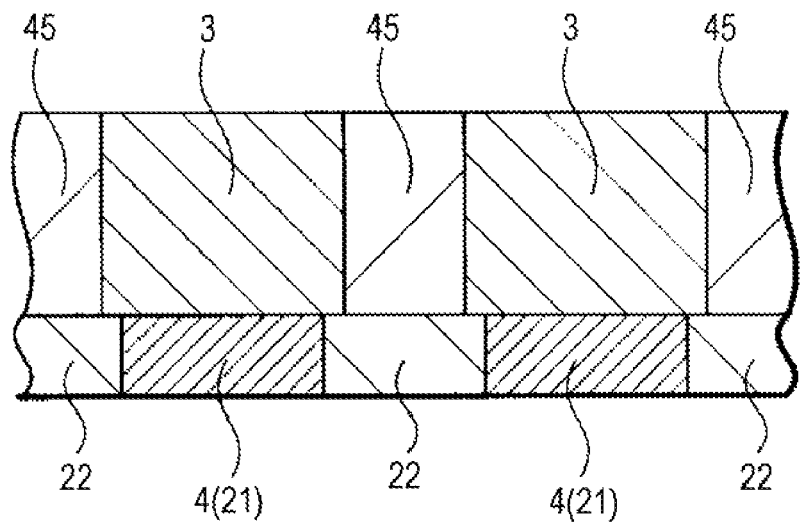

[FIG. 7]
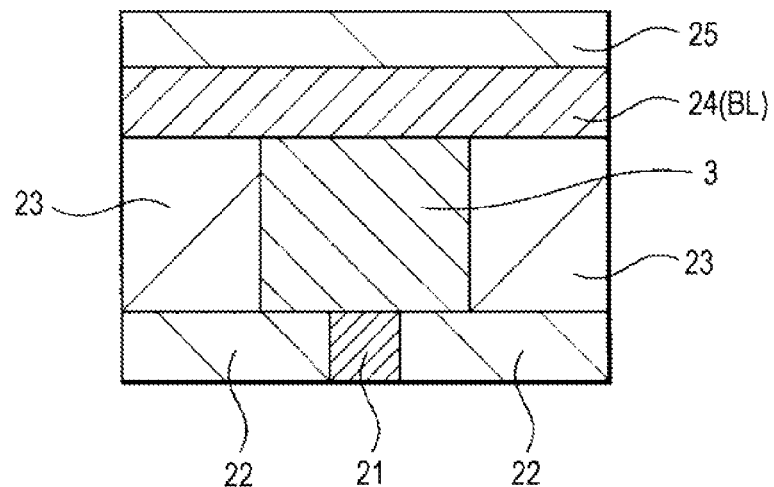
[FIG. 8]
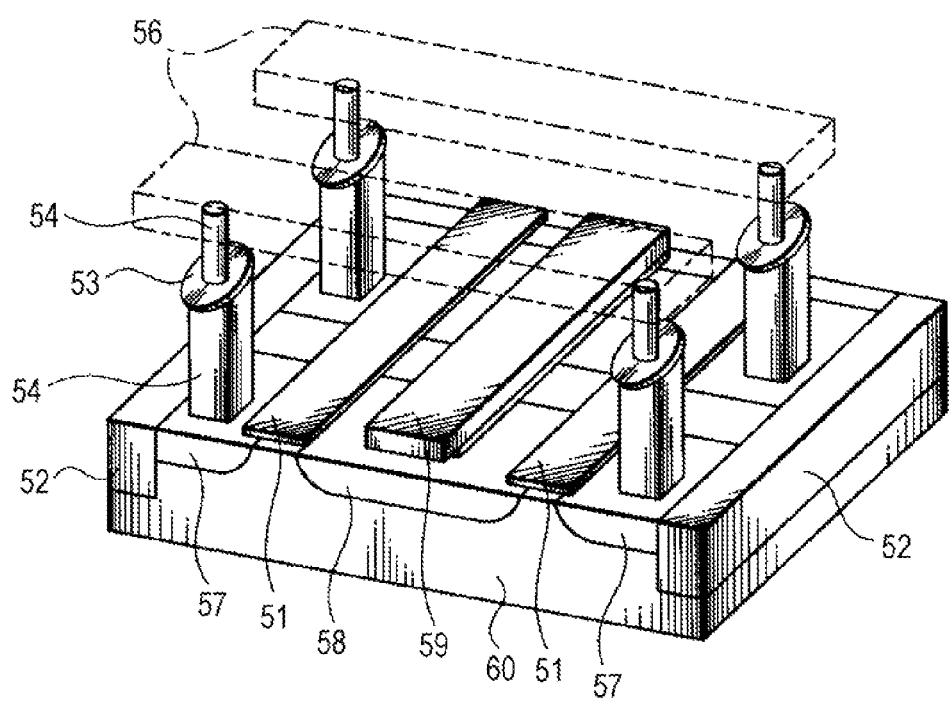

[FIG.9]
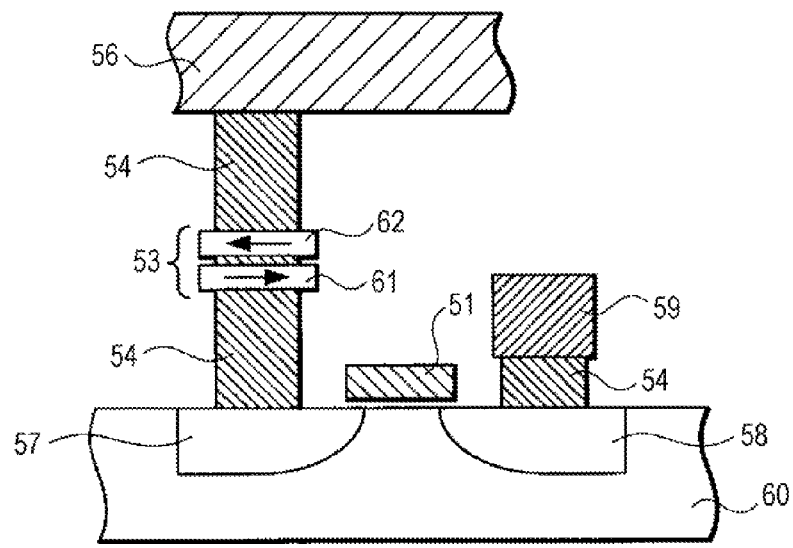
[FIG. 10]
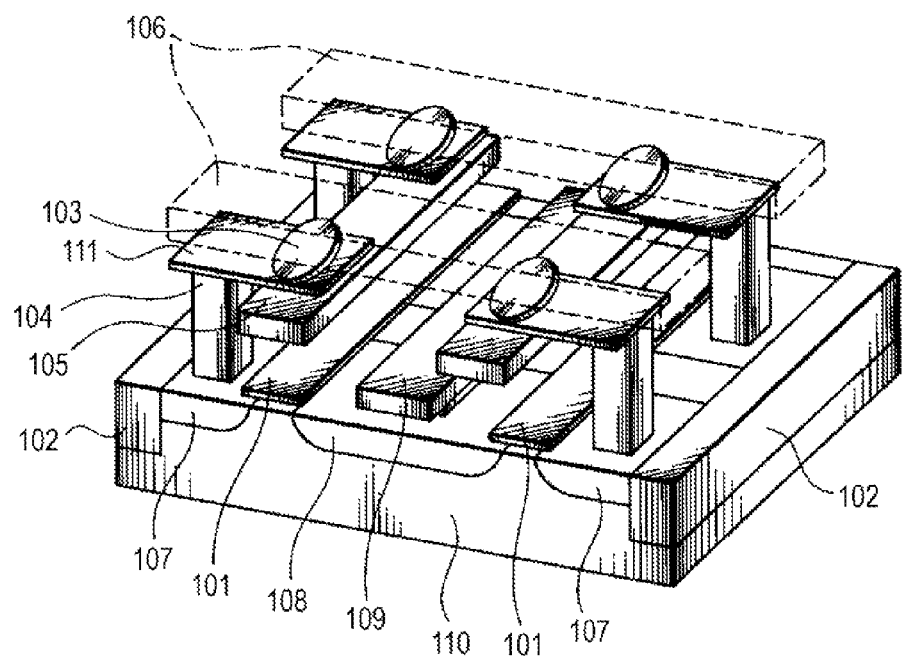

STORAGE ELEMENT AND MEMORY

CROSS REFERENCE TO RELATED APPLICATIONS

The present application is a National Stage of International Application No. PCT/JP2008/061817 filed on Jun. 30, 2008 and which claims priority to Japanese Patent Application No. 2007-188371 filed on Jul. 19, 2007, the entire contents of which are being incorporated herein by reference.

BACKGROUND

The present disclosure relates to a storage element, which changes the direction of magnetization of a storage layer by injecting spin-polarized electrons, and a memory having the storage element and is suitable for being applied to a non-volatile memory.

In an information apparatus, such as a computer, a DRAM with a high operation speed and a high density is widely used as a random access memory.

However, since the DRAM is a volatile memory in which information disappears when the power is turned off, a non-volatile memory in which information does not disappear is desired.

In addition, a magnetic random access memory (MRAM) which records information by magnetization of a magnetic substance has been drawing attention as a candidate for a non-volatile memory and is under development.

In the MRAM, recording of information is performed by applying a current to two kinds of address lines (word line and bit line), which are almost perpendicular to each other, and reversing the magnetization of a magnetic layer of a magnetic storage element, which is located at the intersection of the address lines, by the current magnetic field generated from each address line.

A schematic view (perspective view) of a normal MRAM is shown in FIG. 10.

A drain region 108, a source region 107, and a gate electrode 101 which form a selection transistor for selecting each memory cell are formed in portions separated by an element separation layer 102 of a semiconductor base 110, such as a silicon substrate.

In addition, a word line 105 which extends back and forth in the drawing is provided above the gate electrode 101.

The drain region 108 is formed so as to be common to left and right selection transistors in the drawing, and a wiring line 109 is connected to the drain region 108.

In addition, a magnetic storage element 103 having a storage layer in which the direction of magnetization is reversed is disposed between the word line 105 and a bit line 106 which is disposed above the word line 105 and extends left and right in the drawing. The magnetic storage element 103 is formed by a magnetic tunnel junction element (MTJ element), for example.

In addition, the magnetic storage element 103 is electrically connected to the source region 107 through a horizontal bypass line 111 and a vertical contact layer 104.

Information can be recorded by applying the current magnetic field to the magnetic storage element 103 by applying a current to each of the word line 105 and the bit line 106 so that the direction of magnetization of the storage layer of the magnetic storage element 103 can be reversed.

Moreover, in a magnetic memory, such as the MRAM, it is necessary for a magnetic layer (storage layer) which records the information to have a fixed coercive force in order to stably hold the recorded information.

On the other hand, in order to rewrite the recorded information, it is necessary to apply a certain amount of current to the address line.

However, since the address line becomes thinner as elements which form the MRAM become miniaturized, it becomes impossible to apply a sufficient current.

Therefore, a memory with a configuration in which magnetization reversal caused by spin transfer is used has been drawing attention as a configuration in which the magnetization reversal is possible with a smaller amount of current (for example, refer to Patent Documents 1 and 2 and Non-patent documents 1 and 2).

The magnetization reversal caused by spin transfer means that spin-polarized electrons having passed through the inside of a magnetic substance are injected into another magnetic substance in order to cause magnetization reversal in another magnetic substance.

For example, by applying a current to a giant magnetoresistive effect element (GMR element) or a magnetic tunnel junction element (MTJ element) in a direction perpendicular to the layer surface, the direction of magnetization of at least parts of magnetic layers of the elements can be reversed.

In addition, the magnetization reversal caused by spin transfer is advantageous in that the magnetization reversal can be realized without increasing a current even if the element becomes miniaturized.

A schematic view of a memory with a configuration in which the above-described magnetization reversal caused by spin transfer is used is shown in FIGS. 8 and 9. FIG. 8 is a perspective view, and FIG. 9 is a sectional view.

A drain region 58, a source region 57, and a gate electrode 51 which form a selection transistor for selecting each memory cell are formed in portions separated by an element separation layer 52 of a semiconductor base 60, such as a silicon substrate. Among these, the gate electrode 51 also serves as a word line which extends back and forth in FIG. 8.

The drain region 58 is formed so as to be common to left and right selection transistors in FIG. 8, and a wiring line 59 is connected to the drain region 58.

In addition, a storage element 53 having a storage layer in which the direction of magnetization is reversed by spin transfer is disposed between the source region 57 and a bit line 56 which is disposed above the source region 57 and extends left and right in FIG. 8.

The storage element 53 is formed by a magnetic tunnel junction element (MTJ element), for example. In the drawing, 61 and 62 indicate magnetic layers. It is assumed that one of the two magnetic layers 61 and 62 is a magnetization fixed layer, in which the direction of magnetization is fixed, and the other magnetic layer is a free magnetization layer in which the direction of magnetization changes, that is, a storage layer.

In addition, the storage element 53 is connected to the bit line 56 and the source region 57 through upper and lower contact layers 54, respectively. Accordingly, by applying a current to the storage element 53, the direction of magnetization of the storage layer can be reversed by spin transfer.

Such a memory with a configuration in which the magnetization reversal caused by spin transfer is used also has a feature that the device structure can be simplified compared with the normal MRAM shown in FIG. 10.

In addition, since the magnetization reversal caused by spin transfer is used, it is advantageous in that the write current does not increase even if the element is miniaturized compared with a normal MRAM which performs the magnetization reversal by the external magnetic field.

Meanwhile, in the case of the MRAM, wiring lines (word line and bit line) are provided separately from the storage element and writing (recording) of information is performed by the current magnetic field generated by applying a current to the writing lines. Accordingly, a sufficient amount of current required for writing can flow through the writing lines.

On the other hand, in the memory with a configuration in which the magnetization reversal caused by spin transfer is used, it is necessary to reverse the direction of magnetization of the storage layer by performing the spin transfer using a current flowing through the storage element.

In addition, writing (recording) of information is performed by directly applying a current to the storage element as described above. Accordingly, in order to select a memory cell which performs writing, a storage element is connected with a selection transistor to thereby form a memory cell. In this case, a current flowing through the storage element is limited to the size of a current (saturation current of a selection transistor) which can be applied to the selection transistor.

For this reason, it is necessary to perform the writing with a current equal to or less than the saturation current of the selection transistor. Accordingly, it is necessary to improve the efficiency of spin transfer so that the current flowing through the storage element can be reduced.

In addition, in order to enlarge a read signal, it is necessary to ensure a large magnetoresistance change rate. In order to do so, it is effective to adopt a configuration of a storage element in which an intermediate layer in contact with both sides of a storage layer is made as a tunnel insulating layer (tunnel barrier layer).

In the case of using the tunnel insulating layer as an intermediate layer, the amount of current flowing through the storage element is limited in order to prevent dielectric breakdown of the tunnel insulating layer. Also from this point of view, it is necessary to suppress a current at the time of spin transfer.

[Non-Patent Document 1] Phys. Rev. B 54. 9353 (1996)
[Non-Patent Document 2] J. Magn. Mat. 159. L1 (1996)
[Patent Document 1] Japanese Unexamined Patent Application Publication 2003-17782
[Patent Document 2] U.S. Pat. No. 6,256,223

However, it cannot become a memory if it does not store and hold the information written by a current. Therefore, it is necessary to ensure stability (thermal stability) against heat fluctuations of the storage layer.

In the case of the storage element that uses the magnetization reversal caused by spin transfer, the volume of a storage layer becomes small compared with that of a conventional MRAM; put simply, the thermal stability tends to fall accordingly.

If the thermal stability of the storage layer is not ensured, the reversed direction of magnetization is reversed again by heat and this becomes a writing error.

For this reason, in the storage element that uses the magnetization reversal caused by spin transfer, thermal stability is a very important characteristic.

In general, in the case of an element which seldom spends energy in writing, the information disappears easily because the energy barrier is low.

On the other hand, in the case of an element which needs large energy in writing, it is possible to form a high energy barrier. Accordingly, it can be said that storage of information is also stable.

In a storage element that uses the magnetization reversal caused by spin transfer, the thermal stability becomes high and a large amount of current is required for writing as the amount of saturation magnetization of a storage layer and the volume of the storage layer increase when the comparison is performed in the configuration where the spin transfer efficiency is equal.

Generally, a thermal stability index may be expressed by a thermal stability parameter ($\Delta$).

$\Delta$ is given as $\Delta = KV/kT$ (K: anisotropy energy, V: volume of a storage layer, k: Boltzmann's constant, T: temperature).

Therefore, in order that a storage element with a configuration in which the direction of magnetization of a storage layer is reversed by spin transfer can exist as a memory, it is necessary to improve the spin transfer efficiency so that a current required for the magnetization reversal can be reduced so as to be equal to or smaller than a saturation current of a transistor and to ensure the thermal stability for reliably holding the written information.

Therefore, it is desired to provide a storage element capable of improving the thermal stability without increasing a write current and a memory with a storage element.

SUMMARY

A storage element of an embodiment includes a storage layer which holds information according to a magnetization state of a magnetic substance. A magnetization fixed layer is provided on the storage layer with an intermediate layer interposed therebetween. The intermediate layer is formed of an insulator. The direction of magnetization of the storage layer is changed by injecting electrons spin-polarized in a lamination direction such that the information is recorded in the storage layer. A coefficient of thermal expansion of the storage layer is $1 \times 10^{-5}$ [/K] or more. An insulating layer with a coefficient of thermal expansion of $5 \times 10^{-6}$ [/K] or less is provided at least around the storage layer so that distortion is applied to the storage layer.

According to the above-described configuration of the storage element of the embodiment, the storage layer which holds the information according to the magnetization state of the magnetic substance is provided, the magnetization fixed layer is provided on the storage layer with the intermediate layer interposed therebetween, the intermediate layer is formed of an insulator, and the direction of magnetization of the storage layer is changed by injecting electrons spin-polarized in the lamination direction such that the information is recorded in the storage layer. Accordingly, the information can be recorded by applying a current in the lamination direction to inject spin-polarized electrons.

In addition, the coefficient of thermal expansion of the storage layer is $1 \times 10^{-5}$ [/K] or more and the insulating layer with a coefficient of thermal expansion of $5 \times 10^{-6}$ [/K] or less is provided at least around the storage layer so that distortion is applied to the storage layer. Accordingly, since distortion which is large to some extent is applied from the insulating layer with a relatively small coefficient of thermal expansion to the storage layer with a relatively large coefficient of thermal expansion, it becomes possible to increase the coercive force of the storage layer by magnetostriction. Thus, since it becomes possible to increase the coercive force of the storage layer, the thermal stability of the storage layer can be improved.

In addition, it becomes possible to increase the coercive force without increasing the saturation magnetization of the storage layer.

Accordingly, the thermal stability of the storage layer can be sufficiently ensured without increasing the amount of write current which is required to reverse the direction of the magnetization of the storage layer.

A memory of the present embodiment includes: a storage element which has a storage layer that holds information according to a magnetization state of a magnetic substance and in which the direction of magnetization of the storage layer is changed by applying a current in a lamination direction such that the information is recorded in the storage layer; and a wiring line for supplying a current flowing in the lamination direction of the storage element. The storage element has the configuration of the storage element of the present invention described above.

According to the above-described configuration of the memory of the embodiment, the storage element, which has the storage layer that holds information according to the magnetization state of the magnetic substance and in which the direction of magnetization of the storage layer is changed by applying a current in the lamination direction such that the information is recorded in the storage layer, and the wiring line for supplying a current flowing in the lamination direction of the storage element are provided and the storage element has the configuration of the storage element of the present invention described above. Accordingly, recording of the information using spin transfer can be performed by applying a current in the lamination direction of the storage element through the wiring line.

In addition, since it becomes possible to increase the coercive force of the storage layer, it becomes possible to improve the thermal stability of the storage layer.

In addition, since it becomes possible to increase the coercive force without increasing the saturation magnetization of the storage layer, the thermal stability of the storage layer can be sufficiently ensured without increasing the amount of write current.

A memory according to an embodiment includes: memory cells each being formed by a storage element which has a storage layer that holds information according to a magnetization state of a magnetic substance and in which a magnetization fixed layer is provided on the storage layer with an intermediate layer interposed therebetween, the intermediate layer is formed of an insulator, and the direction of magnetization of the storage layer is changed by injecting electrons spin-polarized in a lamination direction such that the information is recorded in the storage layer; and a wiring line for supplying a current flowing in the lamination direction of the storage element. The memory cells are disposed in a matrix, and distortion is applied to the storage layer by embedding a material with a coefficient of thermal expansion, which is different from that of a material around the storage element of the memory cell, between memory cell rows.

According to the above-described configuration of the memory of the embodiment, the memory cell is formed by the storage element which has the storage layer that holds the information according to the magnetization state of the magnetic substance and in which the magnetization fixed layer is provided on the storage layer with the intermediate layer interposed therebetween, the intermediate layer is formed of an insulator, and the direction of magnetization of the storage layer is changed by injecting electrons spin-polarized in the lamination direction such that the information is recorded in the storage layer. Accordingly, the information can be recorded in the memory cell formed by the storage element by applying a current in the lamination direction of the storage element to inject spin-polarized electrons.

In addition, the memory cells are disposed in a matrix, the wiring line for supplying a current flowing in the lamination direction of the storage element is provided, and distortion is applied to the storage layer by embedding a material with a coefficient of thermal expansion, which is different from that of a material around the storage element of the memory cell, between memory cell rows. Accordingly, it becomes possible to increase the coercive force of the storage layer. Thus, since it becomes possible to increase the coercive force of the storage layer, the thermal stability of the storage layer can be improved.

In addition, it becomes possible to increase the coercive force without increasing the saturation magnetization of the storage layer.

Accordingly, the thermal stability of the storage layer can be sufficiently ensured without increasing the amount of write current which is required to reverse the direction of the magnetization of the storage layer.

A memory according to an embodiment includes: a memory cell formed by a storage element which has a storage layer that holds information according to a magnetization state of a magnetic substance and in which a magnetization fixed layer is provided on the storage layer with an intermediate layer interposed therebetween, the intermediate layer is formed of an insulator, and the direction of magnetization of the storage layer is changed by injecting electrons spin-polarized in a lamination direction such that the information is recorded in the storage layer; and a wiring line for supplying a current flowing in the lamination direction of the storage element. The memory cell is provided in a plural number, and the memory cells adjacent to each other are insulated from each other by an element separation layer and distortion is applied from the element separation layer to the storage layer of the storage element.

According to the above-described configuration of the memory of the embodiment, the memory cell is formed by the storage element which has the storage layer that holds the information according to the magnetization state of the magnetic substance and in which the magnetization fixed layer is provided on the storage layer with the intermediate layer interposed therebetween, the intermediate layer is formed of an insulator, and the direction of magnetization of the storage layer is changed by injecting electrons spin-polarized in the lamination direction such that the information is recorded in the storage layer, and the wiring line for supplying a current flowing in the lamination direction of the storage element is provided. Accordingly, the information can be recorded in the memory cell formed by the storage element by applying a current in the lamination direction of the storage element to inject spin-polarized electrons.

In addition, since the memory cells adjacent to each other are insulated from each other by the element separation layer and distortion is applied from the element separation layer to the storage layer of the storage element, it becomes possible to increase the coercive force of the storage layer. Thus, since it becomes possible to increase the coercive force of the storage layer, the thermal stability of the storage layer can be improved.

In addition, it becomes possible to increase the coercive force without increasing the saturation magnetization of the storage layer.

Accordingly, the thermal stability of the storage layer can be sufficiently ensured without increasing the amount of write current which is required to reverse the direction of the magnetization of the storage layer.

A storage element according to an embodiment includes: a storage layer which holds information according to a magnetization state of a magnetic substance. A magnetization fixed layer is provided on the storage layer with an intermediate layer interposed therebetween. The intermediate layer is formed of an insulator. The direction of magnetization of the storage layer is changed by injecting electrons spin-polarized in a lamination direction such that the information is recorded in the storage layer. A material with a different coefficient of thermal expansion from the storage layer is used for at least one of layers which form the storage element or layers laminated adjacent to the storage element so that distortion is applied to the storage layer.

According to the above-described configuration of the storage element of the embodiment, the storage layer which holds the information according to the magnetization state of the magnetic substance is provided, the magnetization fixed layer is provided on the storage layer with the intermediate layer interposed therebetween, the intermediate layer is formed of an insulator, and the direction of magnetization of the storage layer is changed by injecting electrons spin-polarized in the lamination direction such that the information is recorded in the storage layer. Accordingly, the information can be recorded by applying a current in the lamination direction to inject spin-polarized electrons.

In addition, since a material with a different coefficient of thermal expansion from the storage layer is used for at least one of layers which form the storage element or layers laminated adjacent to the storage element so that distortion is applied to the storage layer, it becomes possible to increase the coercive force of the storage layer. Thus, since it becomes possible to increase the coercive force of the storage layer, the thermal stability of the storage layer can be improved.

In addition, it becomes possible to increase the coercive force without increasing the saturation magnetization of the storage layer.

Accordingly, the thermal stability of the storage layer can be sufficiently ensured without increasing the amount of write current which is required to reverse the direction of the magnetization of the storage layer.

A memory according to an embodiment includes: a storage element which has a storage layer that holds information according to a magnetization state of a magnetic substance and in which the direction of magnetization of the storage layer is changed by applying a current in a lamination direction such that information is recorded in the storage layer; and a wiring line for supplying a current flowing in the lamination direction of the storage element. The storage element has the configuration of the storage element of the present invention described above.

According to the above-described configuration of the memory of the present invention, the storage element, which has the storage layer that holds information according to the magnetization state of the magnetic substance and in which the direction of magnetization of the storage layer is changed by applying a current in the lamination direction such that the information is recorded in the storage layer, and the wiring line for supplying a current flowing in the lamination direction of the storage element are provided and the storage element has the configuration of the storage element of the present invention described above. Accordingly, recording of the information using spin transfer can be performed by applying a current in the lamination direction of the storage element through the wiring line.

In addition, since it becomes possible to increase the coercive force of the storage layer, it becomes possible to improve the thermal stability of the storage layer.

In addition, since it becomes possible to increase the coercive force without increasing the saturation magnetization of the storage layer, the thermal stability of the storage layer can be sufficiently ensured without increasing the amount of write current.

According to the embodiment described above, since thermal stability which is an information holding capacity can be ensured without increasing the amount of current (threshold current) which is required to reverse the direction of magnetization of the storage layer, a storage element with an excellent balance of characteristics can be formed.

Accordingly, since an operation error is removed, an operation margin of the storage element can be sufficiently obtained.

In addition, even if the thermal stability required for a memory is ensured, the write current does not increase. Accordingly, since it becomes unnecessary to apply a large voltage, breakdown of an insulator which is an intermediate layer does not occur.

Therefore, it is possible to realize a highly reliable memory which operates stably.

In addition, even if the write current is reduced, it becomes possible to sufficiently ensure the thermal stability required as a memory. Accordingly, by reducing the write current, the power consumption when performing the writing in the storage element can be reduced.

Therefore, it also becomes possible to reduce the power consumption of the entire memory.

Additional features and advantages are described herein, and will be apparent from, the following Detailed Description and the figures.

BRIEF DESCRIPTION OF THE FIGURES

FIG. 1 is a schematic view (perspective view) of the configuration of a memory of an embodiment.

FIG. 2 is a sectional view of a storage element of FIG. 1.

FIG. 3 is a plan view of the storage element of FIG. 1.

FIG. 4 is a plan view showing the configuration in which a part of the configuration shown in FIG. 3 is changed.

FIG. 5 is a schematic view (plan view) of the configuration of a memory of another embodiment.

FIG. 6A is a schematic view of the configuration of a memory of still another embodiment. FIG. 6B is a sectional view taken along the line X-X of FIG. 6A.

FIG. 7 is a sectional view schematically showing a sample of a storage element manufactured for measurement of characteristics.

FIG. 8 is a schematic view (perspective view) showing the configuration of a memory that uses magnetization reversal caused by spin transfer.

FIG. 9 is a sectional view of the memory shown in FIG. 8.

FIG. 10 is a perspective view schematically showing the configuration of a conventional MRAM.

DETAILED DESCRIPTION

First, specific embodiments of the present invention will be described.

In the present embodiment, recording information is performed by reversing the direction of magnetization of a storage layer of a storage element by the spin transfer described above. The storage layer is formed of a magnetic substance, such as a ferromagnetic layer, and holds information according to the magnetization state (direction of magnetization) of the magnetic substance.

A basic operation of reversing the direction of magnetization of a magnetic layer by spin transfer is to apply a current, which is equal to or larger than a certain threshold value (Ic), to a storage element, which is formed by a giant magnetoresistive effect element (GMR element) or a magnetic tunnel junction element (MTJ element) in a direction perpendicular to the layer surface. At this time, the polarity (direction) of the current depends on the direction of magnetization to be reversed.

If a current with a smaller absolute value than the threshold value is made to flow, the magnetization reversal does not occur.

The threshold value Ic of a current that is needed when reversing the direction of magnetization of a magnetic layer by spin transfer is phenomenologically expressed by the following Expression (1) (for example, refer to F. J. Albert et al., Appl. Phys. Lett., 77, p. 3809, 2000).

[Expression 1]

$$Ic = A\frac{\alpha}{\eta}Ms^2V \quad \text{(Expression 1)}$$

Moreover, in Expression (1), A is a constant, $\alpha$ is a spin damping constant, $\eta$ is a spin transfer efficiency, Ms is the amount of saturation magnetization, and V is the volume of a magnetic layer (storage layer).

In the present embodiment, as expressed in Expression (1), it is used that the threshold value of a current can be arbitrarily set by controlling the volume V of the magnetic layer, the saturation magnetization Ms of the magnetic layer, the spin transfer efficiency, and the damping constant.

In addition, a storage element having a magnetic layer (storage layer), which can hold the information according to the magnetization state, and a magnetization fixed layer in which the direction of magnetization is fixed is formed.

It is necessary to be able to hold the written information in order to exist as a memory. As an index of the capability of holding the information, a determination based on the value of the above-described thermal stability index $\Delta$ is performed. The thermal stability index $\Delta$ of the magnetic layer (storage layer) is expressed by the following Expression (2).

[Expression 2]

$$\Delta = B \cdot Hc_0 \cdot Ms \cdot V \quad \text{(Expression 2)}$$

Moreover, in Expression (2), B is a constant, $Hc_0$ is a coercive force Hc at 0K, Ms is the amount of saturation magnetization, and V is the volume.

In order to hold the stored information for ten years at 85° C., 60 or more is generally needed as a value of the thermal stability index $\Delta$. In many cases, trade-offs are made between the thermal stability index $\Delta$ and the threshold value Ic of a current. Accordingly, in order to maintain the memory characteristic, it becomes a problem to make these compatible in many cases.

For the actual threshold value of a current which changes the magnetization state of a storage layer, a positive-side threshold value +Ic=+0.5 mA, a negative-side threshold value −Ic=−0.3 mA, and the current density in this case is about $3.5 \times 10^6$ A/cm$^2$ in an approximately elliptical tunnel magnetoresistive effect element (TMR element) in which the thickness of a storage layer is 2 nm and the plane pattern is 100 nm×150 nm, for example. These almost match those in the above-described Expression (1).

On the other hand, in a normal MRAM which performs the magnetization reversal by the current magnetic field, a write current of several milliamperes or more is needed.

On the other hand, in the case of performing the magnetization reversal by spin transfer, the threshold value of a write current is sufficiently small as described above. This is effective in reducing the power consumption of an integrated circuit.

In addition, a wiring line (105 in FIG. 10) for generation of a current magnetic field, which is required in the normal MRAM, becomes unnecessary. This is also advantageous in a degree of integration compared with the normal MRAM.

In addition, in the case of performing the magnetization reversal by spin transfer, writing (recording) of information is performed by directly applying a current to a storage element. Accordingly, in order to select a memory cell which performs writing, the memory cell is formed by connecting the storage element with a selection transistor.

In this case, a current flowing through the storage element is limited to the size of a current (saturation current of a selection transistor) which can be applied to the selection transistor. Accordingly, the allowable range of the write current is also limited.

On the other hand, if the amount of magnetization of the storage layer is reduced, the threshold value of the write current is reduced and accordingly, it becomes possible to extend the allowable range. In this case, however, the thermal stability (index $\Delta$) of the storage layer is damaged as described above. In order to form a memory, the thermal stability index $\Delta$ needs to be equal to or larger than a predetermined size.

In addition, in the normal MRAM which performs the magnetization reversal by the current magnetic field, it was necessary to suppress an influence of magnetostriction to be small in order to suppress the coercive force or noise. Accordingly, suppressing of a magnetostriction constant has been one of the big problems.

In addition, in order to suppress the influence of magnetostriction, it has been considered to use a material which makes the magnetostriction constant of a storage layer close to zero. For example, NiFe is a typical material which has a small magnetostriction constant and a soft magnetic property. NiFe has been preferentially used for a read-side magnetic head for a hard disk drive. The improved magnetostriction constant ($\lambda$) of NiFe is $10^{-6}$ to $10^{-7}$.

On the other hand, in the case of a storage element that performs the magnetization reversal by spin transfer, the write current does not necessarily increase even if the coercive force becomes large. Accordingly, it is not necessary to minimize the magnetostriction constant.

Rather, if the coercive force is increased, the thermal stability indicating the holding capacity of the storage element is improved. As a result, the performance of the storage element can be improved.

Specifically, in the present invention, the magnetostriction constant of the storage element is preferably $2 \times 10^{-6}$ or more and $1 \times 10^{-4}$ or less.

The magnetostriction constant may be adjusted by adjusting the composition ratio of Co and Fe, which form a ferromagnetic layer, or by adding a suitable amount of additional elements, such as Al, Ti, V, Cr, Ga, Ge, Tb, Gd, B, C, N, O, P, and S.

However, when the priority is given to a magnetoresistive property or spin transfer efficiency of an MTJ element (TMR element), it is not possible to increase only the magnetostriction constant excessively from the point of view of material selection of a storage layer.

Therefore, as a result of various examinations performed by the inventor of this application and the like, it was found out that the thermal stability could be improved without increasing the write current by applying distortion to a storage layer of an MTJ element in order to improve the coercive force of the storage layer by magnetostriction and accordingly, a stabilized memory could be formed.

Furthermore, it was found out that (1) controlling a material which embeds the periphery of the MTJ element and its forming condition, (2) forming a layer of a material for stress generation in the periphery of the MTJ element, (3) giving the stress by forming an element separation layer between adjacent MTJ elements, (4) forming a liner layer formed of TiN or the like between rows of the MTJ elements arrayed in a matrix and applying the stress in only one direction (row direction), and the like were effective in order to apply the distortion to the storage layer of the MTJ element.

In addition, (5) configuration of applying the stress to the storage layer using a material which has a different coefficient of thermal expansion from the storage layer of the MTJ element and has a large internal stress, such as TiN, for a layer other than the storage layer which forms the MTJ element or a layer laminated adjacent to upper and lower sides of the MTJ element, that is, a base layer, a cap layer, an upper electrode layer, a lower electrode layer, or a hard mask layer in which a mask for patterning the MTJ element at the time of manufacture is left, for example, is effective because the distortion can be applied to the storage layer of the MTJ element.

In the case of this configuration, in addition to TiN, transition metals from IVB group to VIB group, such as Ti, Ta, TaN, W, and WN, and nitrides thereof may be mentioned as materials to be used.

In addition, the base layer, the cap layer, the upper electrode layer, the lower electrode layer which were described above or a layer which forms the MTJ element other than the hard mask layer, for example, a ferromagnetic layer, intermediate layer (for example, a tunnel insulating layer), antiferromagnetic layer, and the like of a magnetization fixed layer may be formed of materials with different coefficients of thermal expansion from the storage layer. In this case, since the characteristics of the storage element are influenced by the ferromagnetic layer, intermediate layer, and antiferromagnetic layer of the magnetization fixed layer, it is preferable that they are formed of materials from which the best characteristics are obtained. Accordingly, materials with different coefficients of thermal expansion from the storage layer are preferably used for the base layer, the cap layer, the upper electrode layer, the lower electrode layer, or the hard mask layer.

As materials of embedding the periphery of the MTJ element of (1), alkali halide type ceramics with small coefficients of linear expansion are advantageous. Specifically, SiN, $SiO_2$, $ZrSiO_4$, and the like may be mentioned. If it is a material formed at the temperature of 250° C. or more, these materials may be satisfactorily used.

More preferably, a configuration (material around the MTJ element, a trench element separation layer, a liner layer, and the like) for applying distortion is selected such that the tensile stress acts in the longitudinal direction (for example, a long-axis direction when the planar shape is elliptical) of the storage layer corresponding to the shape anisotropy of the storage layer of the MTJ element.

In addition, in the configuration of the present embodiment, it is preferable to make the coercive force of the ferromagnetic layer, which forms the storage layer, as large as possible. Specifically, in the MTJ element which has an elliptical planar shape with a short axis of 100 nm and a long axis of 200 nm, it is preferable for the coercive force of the storage layer to be 150 [Oe] or more.

In the configuration of the present embodiment, when the ferromagnetic layer has a coercive force of 150 [Oe] or more, the thermal stability of the storage layer can be sufficiently improved and an increase of an inversion current can be suppressed.

Moreover, in the present invention, a magnetic tunnel junction (MTJ) element is formed using a tunnel insulating layer, which is formed of an insulator, as a non-magnetic intermediate layer between the storage layer and the magnetization fixed layer in consideration of the saturation current value of the selection transistor.

By forming the magnetic tunnel junction (MTJ) element using the tunnel insulating layer, the magnetoresistance change rate (MR rate) can be increased compared with the case where a giant magnetoresistive effect (GMR) element is formed using a non-magnetic conductive layer. As a result, the read signal intensity can be increased.

In addition, particularly by using a magnesium oxide (MgO) as a material of the tunnel insulating layer, the magnetoresistance change rate (MR rate) can be increased more than that in the case where an aluminum oxide, which has been commonly used until now, is used.

Generally, the spin transfer efficiency depends on the MR rate. As the MR rate increases, the spin transfer efficiency is improved and the magnetization reversal current density can be reduced.

Therefore, using a magnesium oxide as a material of the tunnel insulating layer which is an intermediate layer and using a storage layer with the above-described configuration, a write threshold current based on the spin transfer can be reduced. As a result, writing (recording) of information can be performed with a small amount of current. In addition, the read signal intensity can be increased.

This ensures the MR rate (TMR rate). Accordingly, since the write threshold current based on the spin transfer can be reduced, writing (recording) of information can be performed with a small amount of current. In addition, the read signal intensity can be increased.

When the tunnel insulating layer is formed by a magnesium oxide (MgO) layer, the MgO layer is crystallized. Accordingly, it is more preferable to maintain the crystal orientation in the 001 direction.

Moreover, in the present embodiment, not only a configuration (tunnel insulating layer) formed of a magnesium oxide may be adopted for the intermediate layer between the storage layer and the magnetization fixed layer, but also a configuration may be adopted in which various kinds of insulators, dielectrics, and semiconductor, such as aluminum oxide, aluminum nitride, $SiO_2$, $Bi_2O_3$, $MgF_2$, CaF, $SrTiO_2$, $AlLaO_3$, and Al—N—O, are used.

Moreover, in order to obtain a satisfactory magnetoresistive effect characteristic (MR characteristic) when the magnesium oxide is used for the intermediate layer, it is requested that the annealing temperature is 300° C. or more, preferably, a high temperature of 340° C. to 360° C. This is a high temperature compared with the range (250° C. to)280° of the annealing temperature in the case of an aluminum oxide conventionally used for the intermediate layer.

Assumedly, this is because it is required to form a proper internal structure or crystal structure of a tunnel insulating layer, such as a magnesium oxide.

For this reason, also using a heat-resistant ferromagnetic material for a ferromagnetic layer of a storage element so as to be resistant to the high-temperature annealing, the excellent MR characteristics can be obtained.

The sheet resistance value of the tunnel insulating layer needs to be controlled to be equal to or smaller than about several tens of $\Omega\mu m^2$ from the point of view of obtaining a current density required to reverse the direction of magnetization of a storage layer by spin transfer.

Moreover, in the tunnel insulating layer formed by an MgO layer, it is necessary to set the layer thickness of the MgO layer to 1.5 nm or less in order to set the sheet resistance value in the above-described range.

In addition, it is preferable to make a storage element small so that the direction of magnetization of a storage layer can be easily reversed with a small amount of current.

Therefore, preferably, the area of the storage element is set to 0.04 $\mu m^2$ or less.

In addition, it is also possible to directly laminate a storage layer, which has the configuration conditions described above, and another ferromagnetic layer which is differ in a material or the composition range. In addition, a ferromagnetic layer and a soft magnetic layer may be laminated or a plurality of ferromagnetic layers may be laminated with a soft magnetic layer or a non-magnetic layer interposed therebetween. The effects of the present invention can be acquired even in the cases when the lamination is performed as described above.

Particularly in the case where a plurality of ferromagnetic layers is laminated with a non-magnetic layer interposed therebetween, it becomes possible to adjust the strength of interaction between layers of the ferromagnetic layers. Accordingly, an effect is obtained in which it becomes possible to suppress the magnetization reversal current so as not to increase even if the size of the storage element becomes submicron or less. As materials of the non-magnetic layer in this case, Ru, Os, Re, Ir, Au, Ag, Cu, Al, Bi, Si, B, C, Cr, Ta, Pd, Pt, Zr, Hf, W, Mo, Nb, or alloys thereof may be used.

The magnetization fixed layer preferably has the anisotropy in one direction, and the storage layer preferably has the uniaxial anisotropy.

In addition, it is preferable that the layer thickness of each of the magnetization fixed layer and the storage layer is 1 nm to 30 nm.

The other configuration of the storage element may be made to be equal to the conventionally known configuration of a storage element which records information by spin transfer.

The magnetization fixed layer has a configuration in which the direction of the magnetization is fixed using only a ferromagnetic layer or antiferromagnetic coupling of an antiferromagnetic layer and a ferromagnetic layer.

In addition, the magnetization fixed layer has a configuration formed of a single-layered ferromagnetic layer or a laminated ferry structure in which a plurality of ferromagnetic layers is laminated with a non-magnetic layer interposed therebetween.

When the magnetization fixed layer has the laminated ferry structure, the sensitivity of the magnetization fixed layer with respect to the external magnetic field can be reduced. Accordingly, since an unnecessary magnetization fluctuation of the magnetization fixed layer caused by the external magnetic field is suppressed, the storage element can operate stably. In addition, since the layer thickness of each ferromagnetic layer can be adjusted, the leakage field from the magnetization fixed layer can be suppressed.

Co, CoFe, CoFeB, and the like may be used as materials of the ferromagnetic layer which forms the magnetization fixed layer with the laminated ferry structure. In addition, Ru, Re, Ir, Os, and the like may be used as materials of the non-magnetic layer.

Magnetic substances, such as FeMn alloy, PtMn alloy, PtCrMn alloy, NiMn alloy, IrMn alloy, NiO, and $Fe_2O_3$ may be mentioned as materials of the antiferromagnetic layer.

In addition, the magnetic property may be adjusted or various physical properties, such as the crystal structure, crystallinity, and material stability, may be adjusted by adding non-magnetic elements, such as Ag, Cu, Au, Al, Si, Bi, Ta, B, C, O, N, Pd, Pt, Zr, Hf, Ir, W, Mo, and Nb, to such magnetic substances.

In addition, the layer configuration of the storage element may be a configuration in which a storage layer is disposed above a magnetization fixed layer or may be a configuration in which the storage layer is disposed below the magnetization fixed layer.

In addition, as a method of reading the information recorded in the storage layer of the storage element, it is possible to provide a magnetic layer as reference of information on the storage layer of the storage element with a thin insulating layer interposed therebetween and to read the information by a ferromagnetic tunnel current flowing through the insulating layer or to read the information by the magnetoresistive effect.

Next, embodiments o will be described.

As one embodiment, a schematic view (perspective view) of the configuration of a memory is shown in FIG. 1.

This memory is formed by disposing a storage element, which can hold the information in a magnetization state, near an intersection between two kinds of address lines (for example, a word line and a bit line) perpendicular to each other.

That is, a drain region 8, a source region 7, and a gate electrode 1 which form a selection transistor for selecting each memory cell are formed in portions separated by an element separation layer 2 of a semiconductor base 10, such as a silicon substrate. Among these, the gate electrode 1 also serves as one address (for example, a word line) which extends back and forth in the drawing.

The drain region 8 is formed so as to be common to left and right selection transistors in the drawing, and a wiring line 9 is connected to the drain region 8.

In addition, a storage element 3 is disposed between the source region 7 and the other address line (for example, a bit line) 6, which is disposed above the source region 7 and extends left and right in the drawing. The storage element 3 has a storage layer formed by a ferromagnetic layer in which the direction of magnetization is reversed by spin transfer.

In addition, the storage element 3 is disposed near the intersection between two kinds of address lines 1 and 6.

The storage element 3 is connected to the bit line 6 and the source region 7 through upper and lower contact layers 4, respectively.

Accordingly, by applying a current to the storage element 3 in the vertical direction through the two kinds of address lines 1 and 6, the direction of magnetization of the storage layer can be reversed by spin transfer.

In addition, a sectional view of the storage element 3 of the memory of the present embodiment is shown in FIG. 2.

As shown in FIG. 2, in the storage element 3, a magnetization fixed layer 31 is provided below a storage layer 17 in which the direction of magnetization M1 is reversed by spin transfer. An antiferromagnetic layer 12 is provided below the magnetization fixed layer 31, and the direction of magnetization of the magnetization fixed layer 31 is fixed by the antiferromagnetic layer 12.

An insulating layer 16 serving as a tunnel barrier layer (tunnel insulating layer) is provided between the storage layer 17 and the magnetization fixed layer 31, and an MTJ element is formed by the storage layer 17 and the magnetization fixed layer 31.

In addition, a base layer 11 is formed below the antiferromagnetic layer 12, and a cap layer 18 is formed on the storage layer 17.

The magnetization fixed layer 31 has a laminated ferry structure.

Specifically, the magnetization fixed layer 31 has a configuration in which two ferromagnetic layers 13 and 15 are laminated with a non-magnetic layer 14 interposed therebetween and are antiferromagnetically coupled.

Since the ferromagnetic layers 13 and 15 of the magnetization fixed layer 31 have a laminated ferry structure, magnetization M13 of the ferromagnetic layer 13 is a right direction and magnetization M15 of the ferromagnetic layer 15 is a left direction such that they are the opposite directions. Accordingly, magnetic flux leaking from the ferromagnetic layers 13 and 15 of the magnetization fixed layer 31 offsets each other.

Although materials of the ferromagnetic layers 13 and 15 of the magnetization fixed layer 31 are not particularly limited, an alloy material containing one or two or more of iron, nickel, and cobalt may be used. In addition, transition metal elements, such as Nb, Zr, Gd, Ta, Ti, Mo, Mn, and Cu, or light elements, such as Si, B, and C, may also be contained. In addition, the ferromagnetic layers 13 and 15 may be formed by laminating a plurality of layers formed of different materials directly (without a non-magnetic layer interposed therebetween), for example, like a laminated layer of CoFe/NiFe/CoFe.

Ruthenium, copper, chromium, gold, silver, and the like may be used as materials of the non-magnetic layer 14 which forms the laminated ferry of the magnetization fixed layer 31.

Although the layer thickness of the non-magnetic layer 14 changes with a material, it is preferably used in the range of about 0.5 nm to 2.5 nm.

Particularly in the present embodiment, for the storage element 3 with an elliptical planar shape, an insulating layer 41 with a relatively small coefficient of thermal expansion is provided around each layer including the storage layer 17 of the storage element 3 as shown in a plan view of FIG. 3 when the storage element 3 is viewed from above.

In addition, the coefficient of thermal expansion of the storage layer 17 is set to be equal to or larger than $1 \times 10^{-5}$ [/K], and the coefficient of thermal expansion of the insulating layer 41 is set to be equal to or smaller than $5 \times 10^{-6}$ [/K].

Thus, by surrounding the periphery of each layer of the storage element 3, which includes the storage layer 17 with a relatively large coefficient of thermal expansion, with the insulating layer 41 with a relatively small coefficient of thermal expansion, distortion can be applied from the insulating layer 41 to the storage layer 17.

As materials of the insulating layer 41 with a relatively small coefficient of thermal expansion, the above-described alkali halide type ceramics with small coefficients of linear expansion, specifically, SiN, $SiO_2$, $ZrSiO_4$, and the like may be mentioned.

Moreover, in the present embodiment, when the insulating layer 16 which is an intermediate layer is a magnesium oxide layer, the magnetoresistance change rate (MR rate) can be increased.

By increasing the MR rate, the spin transfer efficiency is improved. As a result, the current density required to reverse the direction of the magnetization M1 of the storage layer 17 can be reduced.

The storage element 3 of the present embodiment can be manufactured by continuously forming the base layer 11 to the cap layer 18 in a vacuum apparatus and then forming the pattern of the storage element 3 by processing, such as etching.

According to the configuration of the above-described embodiment, distortion is applied from the insulating layer 41 to the storage layer 17 by providing the insulating layer 41 with a relatively small coefficient of thermal expansion around each layer including the storage layer 17 of the storage element 3, and the coercive force of the storage layer 17 can be increased by magnetostriction.

Accordingly, it becomes possible to sufficiently ensure the thermal stability of the storage layer 17 without increasing the amount of write current which is required to reverse the direction of the magnetization M1 of the storage layer 17.

By improving the thermal stability of the storage layer 17, it becomes possible to increase an operation region where the information is recorded by applying a current to the storage element 3. As a result, since a margin of the operation is ensured widely, the storage element 3 can operate stably.

In addition, even if the sufficient thermal stability is ensured for the storage layer 17 of the storage element 3, the write current does not increase. Accordingly, since it becomes unnecessary to apply a large voltage, dielectric breakdown of the insulating layer 16 which is an intermediate layer does not occur.

Therefore, it is possible to realize a highly reliable memory which operates stably.

In addition, even if the write current is reduced, it becomes possible to sufficiently ensure the thermal stability. Accordingly, by reducing the write current, the power consumption when performing the writing in the storage element 3 can be reduced.

This also makes it possible to reduce the power consumption of the entire memory in which a memory cell is formed by the storage element 3 of the present embodiment.

Accordingly, since it is possible to realize a highly reliable memory which is excellent in the information holding property and operates stably, the power consumption can be reduced in the memory including the storage element 3.

In the present embodiment, the insulating layer 41 formed around the storage element 3 can be formed at a temperature of 250° C. or more and 500° C. or less, which is a relatively high temperature as a MOS process, and under general conditions. In addition, since neither a new mask nor complicated process procedures are needed, it can be formed in a short time.

In addition, instead of the configuration shown in FIG. 3, it is possible to adopt a configuration in which the insulating layer 41 with a relatively small coefficient of thermal expansion is provided only around each layer including the storage layer 17 and the other portions (further outer portion) are made as an insulating layer 42 which is normally used, as shown in a plan view of FIG. 4.

Also in this configuration, distortion can be applied to the storage layer 17 of the storage element 3 from the insulating layer 41 with a relatively small coefficient of thermal expansion.

Moreover, in the configuration shown in FIG. 3 or 4, the insulating layer 41 with a relatively small coefficient of thermal expansion does not necessarily cover the entire periphery of a laminated layer of the storage element 3, and may cover at least the periphery of the storage layer 17 of the storage element 3 with the insulating layer 41 so that distortion can be applied to the storage layer 17.

Next, a schematic view (plan view) of the configuration of a memory (storage device) is shown in FIG. 5 as another embodiment of the present invention.

As shown in FIG. 5, each memory cell is formed by the storage element 3 with an elliptical planar shape, and many memory cells are disposed in a matrix.

The storage element 3 which forms each memory cell may have a layer configuration whose sectional view is shown in FIG. 2, for example.

Particularly in the memory of the present embodiment, a liner layer 43 formed of a material with a different coefficient of thermal expansion from the periphery of the storage element 3 is formed between rows of memory cells in a belt shape.

This liner layer 43 is formed in parallel with the long-axis direction (longitudinal direction; row direction) of the elliptical storage element 3.

In addition, an insulating layer 44 is embedded between the liner layer 43 and the storage element 3 of each memory cell.

Since insulation between memory cells is ensured by the insulating layer 44 around the storage element 3, a material of the liner layer 43 may have not only an insulation property but also conductivity. Therefore, it may also be used as a wiring line for applying a current or a wiring line for transmitting a signal, for example.

As a material of the liner layer 43, for example, a material with a relatively small coefficient of thermal expansion, for example, TiN is suitable. In addition to this, transition metal materials from IVB group to VIB group, such as Ti, Ta, TaN, W, and WN, or SiN, AlN, $Al_2O_3$, $ZeO_2$, and the like may be mentioned.

By using a material with a relatively small coefficient of thermal expansion, a stress is generated from the liner layer 43 whose coefficient of thermal expansion is smaller than that of the insulating layer 44 so that distortion can be applied to the storage layer 17 through the insulating layer 44.

On the other hand, a material with a relatively large coefficient of thermal expansion which has a sufficiently larger coefficient of thermal expansion than the insulating layer 44 around the storage element 3 may also be used as a material of the liner layer 43.

That is, it is preferable that a material with a different coefficient of thermal expansion from the insulating layer 44 around the storage element 3 is used for the liner layer 43.

According to the configuration of the embodiment described above, since the liner layer 43 formed of a material with a different coefficient of thermal expansion from the insulating layer 44 around the storage element 3 is provided in a belt shape between rows of memory cells formed by the storage elements 3, distortion is applied from the liner layer 43 to the storage layer 17 through the insulating layer 44 and the coercive force of the storage layer 17 can be increased by magnetostriction.

Accordingly, the thermal stability of the storage layer 17 can be sufficiently ensured without increasing the amount of write current which is required to reverse the direction of the magnetization M1 of the storage layer 17.

By improving the thermal stability of the storage layer 17, it becomes possible to increase an operation region where the information is recorded by applying a current to the storage element 3. As a result, since a margin of the operation is ensured widely, the storage element 3 can operate stably.

In addition, even if the sufficient thermal stability is ensured for the storage layer 17 of the storage element 3, the write current does not increase. Accordingly, since it becomes unnecessary to apply a large voltage, dielectric breakdown of the insulating layer 16 which is an intermediate layer does not occur.

Therefore, it is possible to realize a highly reliable memory which operates stably.

In addition, even if the write current is reduced, it becomes possible to sufficiently ensure the thermal stability. Accordingly, by reducing the write current, the power consumption when performing the writing in the storage element 3 can be reduced.

This also makes it possible to reduce the power consumption of the entire memory in which a memory cell is formed by the storage element 3 of the present embodiment.

Accordingly, since it is possible to realize a highly reliable memory which is excellent in the information holding property and operates stably, the power consumption can be reduced in the memory including the storage element 3.

In the present embodiment, the liner layer 43 can be formed at a temperature of 250° C. or more and 500° C. or less, which is a relatively high temperature as a MOS process, and under general conditions. In addition, since complicated process procedures are not needed, it can be formed in a short time.

Next, a memory (storage device) of another embodiment will be described.

In the present embodiment, there is a feature in the layer configuration of a storage element which forms each memory cell of a memory.

Specifically, in the layer configuration of the storage element 3 shown in the sectional view of FIG. 2, at least one layer among the base layer 11, the cap layer 18, a lower electrode layer (not shown) provided so as to be connected to a lower layer of the base layer 11, an upper electrode layer (not shown) provided so as to be connected to an upper layer of the cap layer 18, and a hard mask layer in which a mask used to pattern a laminated layer (MTJ element) of the storage element 3 at the time of manufacture is left is formed using a material with a sufficiently smaller coefficient of thermal expansion than the storage layer 17.

Not only a material, such as TiN, transition metals from IVB group to VIB group, such as Ti, Ta, TaN, W, and WN, and nitrides thereof may be used as such materials.

By using such materials, distortion can be applied to the storage layer 17 from the layer whose coefficient of thermal expansion is sufficiently smaller than that of the storage layer 17.

The periphery of the storage element of the present embodiment can be formed at a temperature of 250° C. or more and 500° C. or less, which is a relatively high temperature as a MOS process, and under general conditions. In addition, since neither a new mask nor complicated process procedures are needed, it can be formed in a short time.

Next, a schematic view (plan view) of the configuration of a memory (storage device) is shown in FIG. 6A as another embodiment.

As shown in FIG. 6A, each memory cell is formed by the storage element 3 with an elliptical planar shape, and memory cells are disposed in a matrix.

The memory cells are insulated from each other by an element separation layer 45 which is an insulating layer.

In the present embodiment, distortion is further applied from the element separation layer 45 to the storage layer 17 of the storage element 3.

In order to do so, for example, the above-described alkali halide type ceramics with small coefficients of linear expansion, specifically, materials with small coefficients of thermal expansion, such as SiN, $SiO_2$, and $ZrSiO_4$, are preferably used for the element separation layer 45.

Here, a sectional view taken along the line X-X of FIG. 6A is shown in FIG. 6B.

The storage element 3 is formed on the contact layer 4 (21) that is separated for every memory cell by an insulating layer 22.

In addition, the element separation layer 45 is formed so as to be embedded between the storage elements 3 of the memory cells.

In order to form the element separation layer 45 shown in FIGS. 6A and 6B, for example, the following manufacturing process is adopted.

First, a laminated layer of the storage element 3 is formed over the entire surface.

Then, the laminated layer of the storage element 3 is separated into memory cells by patterning using etching.

Then, a hole made between the memory cells is embedded to thereby form the element separation layer 45.

Then, the excessive element separation layer 45 is removed if it remains on the storage element 3.

In this way, the sectional structure shown in FIG. 6B can be made.

According to the configuration of the embodiment described above, since memory cells formed by the storage elements 3 are insulated from each other by the element separation layer 45 and the distortion is applied from the element separation layer 45 to the storage layer 17 of the storage element 3, the coercive force of the storage layer 17 can be increased by magnetostriction.

Accordingly, the thermal stability of the storage layer 17 can be sufficiently ensured without increasing the amount of write current which is required to reverse the direction of the magnetization M1 of the storage layer 17.

By improving the thermal stability of the storage layer 17, it becomes possible to increase an operation region where the information is recorded by applying a current to the storage element 3. As a result, since a margin of the operation is ensured widely, the storage element 3 can operate stably.

In addition, even if the sufficient thermal stability is ensured for the storage layer 17 of the storage element 3, the write current does not increase. Accordingly, since it becomes unnecessary to apply a large voltage, dielectric breakdown of the insulating layer 16 which is an intermediate layer does not occur.

Therefore, it is possible to realize a highly reliable memory which operates stably.

In addition, even if the write current is reduced, it becomes possible to sufficiently ensure the thermal stability. Accordingly, by reducing the write current, the power consumption when performing the writing in the storage element 3 can be reduced.

This also makes it possible to reduce the power consumption of the entire memory in which a memory cell is formed by the storage element 3 of the present embodiment.

Accordingly, since it is possible to realize a highly reliable memory which is excellent in the information holding property and operates stably, the power consumption can be reduced in the memory including the storage element 3.

Moreover, in the present embodiment, the planar shape of a storage element is not limited to the approximately elliptical shape shown in FIGS. 3, 4, 5, and 6A and other shapes are possible. However, giving shape anisotropy to a storage layer is advantageous in regulating the direction of magnetization in two opposite directions.

In addition to the elliptical shape, for example, a spindle shape and a rectangular shape may be considered.

Here, materials or layer thicknesses of respective layers, including a ferromagnetic material which forms a storage layer, a liner layer, a hard mask layer, an embedding material, and the like, were specifically selected in the configuration of the storage element of the present embodiment and the characteristics were checked.

Although a semiconductor circuit for switching and the like as well as the storage element exist in an actual memory as shown in FIG. 1 or 8, an explanation on a selection transistor or a process of manufacturing a lower layer wiring line is omitted.

In addition, although the contact layers 4 are connected to the upper and lower sides of the storage element 3 in FIG. 1, a structure is adopted here in which a bit line 24 (BL) is directly connected on the storage element 3 as shown in the sectional view of FIG. 7.

<First Experiment>

A liner layer was provided between memory cells, and a material of the liner layer was changed to check the characteristic.

As shown in FIG. 7, the storage element 3 with the configuration shown in FIG. 2 was formed on the insulating layer 22 in which the contact layer 21 connected to a lower layer wiring line was formed.

Specifically, in the storage element 3 with the configuration shown in FIG. 2, the respective layers were formed by selecting, for materials and layer thicknesses of the layers, a Ta layer with a layer thickness of 3 nm as the base layer 11, a PtMn layer with a layer thickness of 20 nm as the antiferromagnetic layer 12, a CoFe layer with a layer thickness of 2 nm as the ferromagnetic layer 13 which formed the magnetization fixed layer 31, a CoFeB layer with a layer thickness of 2.5 nm as the ferromagnetic layer 15, an Ru layer with a layer thickness of 0.8 nm as the non-magnetic layer 14 which formed the magnetization fixed layer 31 with the laminated ferry structure, a magnesium oxide layer with a layer thickness of 0.9 nm as an insulating layer (barrier layer) 16 serving as a tunnel insulating layer, a CoFeB layer with a layer thickness of 3 nm as the storage layer 17, and a Ta layer with a layer thickness of 5 nm as the cap layer 18 and a Cu layer (not shown; that serving as a word line to be described later) with a layer thickness of 100 nm was provided between the base layer 11 and the antiferromagnetic layer 12.

In the above-described layer configuration, the composition of the PtMn layer was set to Pt50Mn50 (atomic %) and the composition of the CoFe layer was set to Co90Fe10 (atomic %).

The ratio of Co and Fe of the CoFeB layer was set to 80:20.

Each layer other than insulating layer 16 formed by a magnesium oxide layer was formed using a DC magnetron sputtering method.

The insulating layer 16 formed by a magnesium oxide (MgO) layer was formed using an RF magnetron sputtering method.

In addition, after forming the respective layers of the storage element 3, heat treatment was performed for two hours at 10 kOe and 360° C. in a heat treatment furnace within the magnetic field such that regulated heat treatment of the PtMn layer of the antiferromagnetic layer 12 was performed.

After masking a word line portion by photolithography, a word line (lower electrode) was formed by performing selective etching with Ar plasma on the laminated layer of a portion other than the word line. In this case, the portion other than the word line was etched up to the depth 5 nm of the substrate.

Then, a mask of the pattern of the storage element 3 was formed by an electron beam drawing apparatus and selective etching was performed on the laminated layer to thereby form the storage element 3. A portion other than the storage element 3 portion was etched up to right above the Cu layer of the word line.

In addition, since a sufficient amount of current needs to be applied to the storage element for characteristic evaluation in order to generate the spin torque required for magnetization reversal, it is necessary to suppress a resistance value of a tunnel insulating layer. Accordingly, the pattern of the storage element 3 was formed in the elliptical shape of 0.09 μm (short axis)×0.18 μm (long axis) and the sheet resistance value (Ωμm$^2$) of the storage element 3 was set to 30 Ωμm$^2$.

Then, the portion other than the storage element 3 portion was embedded, the insulating layer 23 formed of a silicon oxide with a thickness of about 150 nm was formed by sputtering, and the storage element 3 was insulated from the periphery.

Then, the bit line 24 serving as an upper electrode and the liner layer 43 were sequentially formed by patterning using photolithography. The liner layer 43 was formed to have a width of 150 nm and a thickness of 50 nm such that the arrangement relationship shown in FIG. 5 is realized between the liner layer 43 and the storage element 3.

In addition, the bit line 24 or the liner layer 43 was covered to form the insulating layer 25, a part of the insulating layer 25 on the bit line 24 was opened to form a measurement pad.

In this way, samples of the memory which had many memory cells formed by the storage elements 3 and in which the liner layer 43 was formed in the row direction between rows of the memory cells were manufactured.

In addition, memories were manufactured while changing a material of the liner layer 43 to TaN (tantalum nitride), SiN (silicon nitride; coefficient of thermal expansion of 2.6×10$^{-6}$/K), TiN (titanium nitride; coefficient of thermal expansion of 4.1×10$^{-6}$/K), 2Al$_2$O$_3$.5SiO$_2$.2MgO (coefficient of thermal expansion 2.5×10$^{-6}$/K), and Al$_2$O$_3$.4SiO$_2$LiO$_2$ (coefficient of thermal expansion 1.9×10$^{-6}$/K), and they were used as a sample of each example.

In addition, a memory was manufactured under conditions in which the liner layer 43 was not formed but the others were similar to the sample of the embodiment, and it was used as a sample of a comparative example.

For the manufactured samples of the example and comparative example, measurement of characteristics was performed as follows.

(Measurement of Coercive Force)

First, the resistance value of the storage element was measured while adding the external magnetic field, which changes continuously, to the storage element. At this time, the temperature was set to the room temperature of 25° C., and the bias voltage applied between a terminal of the word line and a terminal of the bit line was adjusted to become 10 mV.

In addition, when the external magnetic field exceeds the coercive force of a storage layer while applying the external magnetic field in the opposite direction to the direction of magnetization of the storage layer, the direction of magnetization of the storage layer is reversed. Since the resistance value of the storage element changes when the direction of magnetization is reversed, the coercive force of the storage element was acquired assuming that the size of the external magnetic field when the resistance value changed was equal to the coercive force of the storage element.

(Measurement of an Inversion Current Value)

A current with a pulse width of 1 μs to 100 ms was applied to the storage element and then the resistance value of the storage element was measured. When measuring the resistance value of the storage element, the temperature was set to the room temperature of 25° C. and the bias voltage applied between a terminal of the word line and a terminal of the bit line was adjusted to become 10 mV.

In addition, an inversion current value at which the magnetization of the storage layer was reversed was calculated by changing the amount of current flowing through the storage element.

In addition, in order to take variations among storage elements into consideration, about twenty storage elements with the same configuration were manufactured and the average value of inversion current values was calculated by performing the above-described measurement.

Here, for convenience's sake, the inversion current value when a current is made to flow from a word line to a bit line is denoted as Ic$^+$, and the inversion current value when a current is made to flow from a bit line to a word line is denoted as Ic$^-$. Inversion from the parallel state to the anti-parallel state occurs when a current is made to flow from a word line to a bit line, and inversion from the anti-parallel state to the parallel state occurs when a current is made to flow from a bit line to a word line. The Ic value at each pulse width was plotted at a horizontal-axis pulse width, and the value extrapolated to the pulse width of 1 ns was set to an Ic$_0$ value.

In addition, the average value of the absolute values of Ic$_0$ values obtained from Ic$^+$ and Ic$^-$ was calculated, and this was set as the inversion current value of each sample.

(Measurement of Thermal Stability Index Δ)

From the current value Ic measured at each pulse width and the value of Ic$_0$ calculated by the above-described method, the thermal stability index Δ was derived according to the following Expression 3. In Expression 3, the value of τ$_0$ is an inverse of a spin rotation frequency and is usually set to 1 ns.

[Expression 3]

$$Ic = Ic_0\left[1 - \frac{1}{\Delta}ln\left(\frac{\tau}{\tau_0}\right)\right] \quad \text{(Expression 3)}$$

As a result of the measurement, the values of coercive force Hc, thermal stability index Δ, and inversion current value Ic$_0$ obtained by the measurement are collectively shown in Table 1.

TABLE 1

| Liner layer material | Hc[Oe] | Δ | Ic$_0$[mA] | Remarks |
|---|---|---|---|---|
| none | 100 | 40 | 0.40 | comparative example |
| TaN | 160 | 70 | 0.40 | example |
| SiN | 180 | 80 | 0.45 | example |
| TiN | 200 | 85 | 0.45 | example |
| 2Al$_2$O$_3$•5SiO$_2$•2MgO | 180 | 80 | 0.45 | example |
| Al$_2$O$_3$•4SiO$_2$•LiO$_2$ | 160 | 70 | 0.40 | example |

Table 1 shows that both the coercive force Hc and the thermal stability index Δ of each sample of the example in which the liner layer 43 was formed are improved more than those of the sample of the comparative example.

Among the samples of the example, the sample that used TiN (titanium nitride) as a material of the liner layer 43 was largest in the coercive force Hc and the thermal stability index Δ.

In addition, the inversion current value Ic$_0$ is equal or slightly larger than that in the comparative example. Even if the liner layer 43 is provided, the inversion current value does not increase largely.

Accordingly, by providing the liner layer 43 to improve the coercive force Hc or thermal stability index Δ of the storage layer 17, it becomes possible to sufficiently ensure the thermal stability of the storage layer 17 without increasing the inversion current value (that is, the amount of write current).

In addition, since a margin of the operation is ensured widely, the storage element 3 can operate stably.

In each sample of the example of the first experiment, the liner layer 43 is patterned and formed after the periphery of the storage element 3 is embedded by the insulating layer 23. Accordingly, the liner layer 43 is formed above the insulating layer 23.

On the other hand, it is also possible to form a groove by digging the insulating layer 23 and to embed a material of the liner layer 43 in the groove to thereby form the liner layer 43, for example.

<Second Experiment>

A hard mask layer was left on a laminated layer of a storage element, and the characteristics were checked while changing the material of the hard mask layer.

Similar to the first experiment, respective layers of the storage element 3 were formed and regulated heat treatment of the PtMn layer of the antiferromagnetic layer 12 was performed.

Then, a hard mask layer with a thickness of 100 nm was formed on the uppermost layer (cap layer 18) of the storage element 3.

Then, a word line was formed similar to the first experiment, and a resist mask of a pattern of the storage element 3 was formed.

Then, a hard mask layer was patterned using the resist mask.

In addition, after removing the resist mask, each layer of the storage element 3 was patterned using the hard mask layer.

Then, the insulating layer 23 formed of a silicon oxide with a thickness of about 150 nm was formed by sputtering in a portion other than the storage element 3 portion, and the storage element 3 was insulated from the periphery.

Then, the bit line 24 serving as an upper electrode was formed on the hard mask layer using photography. That is, the hard mask layer is provided between the storage element 3 and the bit line 24 in the sectional structure shown in FIG. 7.

In addition, after covering the bit line 24 to form the insulating layer 25, a part of the insulating layer 25 was opened to form a measurement pad.

In this way, samples of the memory which had many memory cells formed by the storage elements 3 were manufactured.

In addition, memories were manufactured while changing a material of the hard mask layer to TiN (titanium nitride), WN (tungsten nitride), TaN (tantalum nitride), and Mo (molybdenum). Among these, the sample which used Mo for the hard mask layer was adopted as a comparative example because the difference between the coefficient of thermal expansion of CoFeB of the storage layer 17 and that of the sample was small and a little stress was given to the storage layer 17. The other samples were adopted as examples.

For the manufactured samples of the example and comparative example, measurement of characteristics was performed in the same manner as in the first experiment.

As a result of the measurement, the values of coercive force Hc, thermal stability index Δ, and inversion current value $Ic_0$ obtained by the measurement are collectively shown in Table 2.

TABLE 2

| Hard mask material | Hc[Oe] | Δ | $Ic_0$[mA] | Remarks |
|---|---|---|---|---|
| TiN | 180 | 85 | 0.45 | example |
| WN | 160 | 75 | 0.45 | example |
| TaN | 140 | 65 | 0.40 | example |
| Mo | 100 | 40 | 0.40 | comparative example |

TABLE 2-continued

Table 2 shows that both the coercive force Hc and the thermal stability index Δ of the sample of each example in which TiN, WN, or TaN was used for the hard mask layer are higher than those of the sample of the comparative example that used Mo.

Among the samples of the example, the sample that used TiN (titanium nitride) as a material of the hard mask layer was largest in the coercive force Hc and the thermal stability index Δ.

In addition, the inversion current value $IC_0$ is equal or slightly larger than that in the comparative example. Even if a hard mask layer formed of TiN, WN, or TaN is provided, the inversion current value does not increase largely.

Accordingly, by providing a hard mask layer formed of TiN, WN, or TaN on the storage element 3 to improve the coercive force Hc or thermal stability index Δ of the storage layer 17, it becomes possible to sufficiently ensure the thermal stability of the storage layer 17 without increasing the inversion current value (that is, the amount of write current).

In addition, since a margin of the operation is ensured widely, the storage element 3 can operate stably.

<Third Experiment>

The characteristics were checked while changing the material of the insulating layer 23 embedded in the periphery of a storage element.

Similar to the first experiment, respective layers of the storage element 3 were patterned.

Then, the insulating layer 23 with a thickness of about 150 nm was formed by sputtering in a portion other than the storage element 3 portion, and the storage element 3 was insulated from the periphery.

Then, the bit line 24 serving as an upper electrode was formed using photography.

In addition, after covering the bit line 24 to form the insulating layer 25, a part of the insulating layer 25 was opened to form a measurement pad.

In this way, samples of the memory which had many memory cells formed by the storage elements 3 were manufactured.

In addition, memories were manufactured while changing the insulating material of the insulating layer 23, which was embedded in the periphery of the storage element 3, to SiN (silicon nitride; coefficient of thermal expansion of $2.6 \times 10^{-6}$/K), SiO (silicon oxide; coefficient of thermal expansion of $3.0 \times 10^{-6}$/K), $Al_2O_3$ (aluminum oxide; coefficient of thermal expansion of $7.2 \times 10^{-6}$/K), $ZrSiO_4$ (coefficient of thermal expansion of $4.1 \times 10^{-6}$/K), and $Al_2O_3 \cdot TiO_2$ (coefficient of thermal expansion of $1.4 \times 10^{-6}$/K). Among these, the sample which used $Al_2O_3$ (aluminum oxide) was adopted as a comparative example because the difference between the coefficient of thermal expansion of the storage layer 17 and that of the sample was small and a little stress was given to the storage layer 17. The other samples were adopted as the examples.

For the manufactured samples of the example and comparative example, measurement of characteristics was performed in the same manner as in the first experiment.

As a result of the measurement, the values of coercive force Hc, thermal stability index Δ, and inversion current value $Ic_0$ obtained by the measurement are collectively shown in Table 3.

TABLE 3

| Embedding material | Hc[Oe] | Δ | $Ic_0$[mA] | Remarks |
|---|---|---|---|---|
| SiN | 170 | 80 | 0.45 | example |
| SiO | 140 | 65 | 0.45 | example |
| $Al_2O_3$ | 100 | 40 | 0.40 | comparative example |
| $ZrSiO_4$ | 180 | 80 | 0.45 | example |
| $Al_2O_3 \cdot TiO_2$ | 150 | 70 | 0.40 | example |

Table 3 shows that both the coercive force Hc and the thermal stability index Δ of the sample of each example are higher than those of the sample of the comparative example.

Among the samples of the example, the sample that used $ZrSiO_4$ as a material of the insulating layer 23 was largest in the coercive force Hc and the thermal stability index Δ.

In addition, the inversion current value $Ic_0$ is equal or slightly larger than that in the comparative example. Even if SiN, SiO, $ZrSiO_4$, and $Al_2O_3TiO_2$ are used for the insulating layer 23, the inversion current value does not increase largely.

Accordingly, by using SiN, SiO, $ZrSiO_4$, and $Al_2O_3TiO_2$ as materials of the insulating layer 23 embedded in the periphery of the storage element 3 in order to improve the coercive force Hc or thermal stability index Δ of the storage layer 17, it becomes possible to sufficiently ensure the thermal stability of the storage layer 17 without increasing the inversion current value (that is, the amount of write current).

In addition, since a margin of the operation is ensured widely, the storage element 3 can operate stably.

Moreover, regarding the condition in which the coefficient of thermal expansion of the insulating layer 23 embedded in the periphery of the storage element 3 described above is set to $5 \times 10^{-6}$ [/K] or less, each sample of the example satisfied the condition, but the sample of the comparative example which used aluminum oxide for the insulating layer 23 did not satisfy the condition.

Accordingly, by making the condition of the coefficient of thermal expansion satisfied by improving the coercive force Hc or thermal stability index Δ of the storage layer 17, the thermal stability of the storage layer 17 is sufficiently ensured without increasing the inversion current value (that is, the amount of write current). As a result, the storage element 3 can operate stably.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A memory comprising:
   memory cells each being formed by a storage element which has a storage layer having shape anisotropy and that holds information according to a magnetization state of a magnetic substance and in which a magnetization fixed layer is provided on the storage layer with an intermediate layer interposed therebetween, the intermediate layer is formed of an insulator, and the direction of magnetization of the storage layer is changed by injecting electrons spin-polarized in a lamination direction such that the information is recorded in the storage layer; and
   a wiring line for supplying a current flowing in the lamination direction of the storage element,
   wherein the memory cells are disposed in a matrix,
   wherein a first material is applied around perimeters of the storage elements of the memory cell as viewed from a top view of the storage element,
   wherein distortion is applied to the storage layer by embedding a second material with a coefficient of thermal expansion which is different from that of the first material between memory cell rows, the second material not being in direct contact with the memory cells,
   wherein the storage element of the memory cell has a planar shape in which a row direction of the memory cell is a longitudinal direction, and
   wherein the second material is formed in a strip-shape between rows in a direction parallel to the row direction of the memory cells.

2. The memory according to claim 1, wherein the strip-shaped second material is configured to apply distortion primarily in one direction to the storage layers.

* * * * *